United States Patent
Stein

(10) Patent No.: US 9,728,438 B2
(45) Date of Patent: Aug. 8, 2017

(54) METHOD FOR PRODUCING AN ELECTROSTATIC HOLDING APPARATUS

(71) Applicant: Berliner Glas KGaA Herbert Kubatz GmbH & Co., Berlin (DE)

(72) Inventor: Alexander Stein, Berlin (DE)

(73) Assignee: Berliner Glas KGaA Herbert Kubatz GmbH & Co., Berlin (DE)

( * ) Notice: Subject to any disclaimer, the term of this patent is extended or adjusted under 35 U.S.C. 154(b) by 139 days.

(21) Appl. No.: 14/724,215

(22) Filed: May 28, 2015

(65) Prior Publication Data
US 2015/0348816 A1 Dec. 3, 2015

(30) Foreign Application Priority Data
May 28, 2014 (DE) .................. 10 2014 008 030

(51) Int. Cl.
*H01L 21/683* (2006.01)
(52) U.S. Cl.
CPC ......... *H01L 21/6833* (2013.01); *Y10T 156/10* (2015.01)
(58) Field of Classification Search
CPC .......................... H01L 21/6833; Y10T 156/10
See application file for complete search history.

(56) References Cited

U.S. PATENT DOCUMENTS

| | | |
|---|---|---|
| 4,502,094 A | 2/1985 | Lewin et al. |
| 5,535,090 A | 7/1996 | Sherman |
| 7,963,308 B2 * | 6/2011 | Muramoto .......... B32B 37/0015 156/381 |
| 8,476,167 B2 | 7/2013 | Van Mierlo et al. |
| 8,902,562 B2 | 12/2014 | Helmus et al. |
| 2005/0181617 A1 | 8/2005 | Bosch |
| 2005/0277244 A1 * | 12/2005 | Galster .................. B22F 7/064 438/202 |

(Continued)

FOREIGN PATENT DOCUMENTS

| | | |
|---|---|---|
| EP | 1521120 A2 | 4/2005 |
| EP | 2793083 A1 | 10/2014 |

(Continued)

OTHER PUBLICATIONS

English abstract for JP 2007027494 A (2007).

*Primary Examiner* — Scott Bauer
(74) *Attorney, Agent, or Firm* — Caesar Rivise, PC

(57) ABSTRACT

Production of a holding apparatus (100) for electrostatically holding a component, e.g., silicon wafer (1), includes connecting plate-type first holding element (11, 12) and plate-type core element (13), first holding element (11, 12) having first electrode device (20) and spanning support surface for receiving component (1), and the connecting includes the steps: providing liquid adhesive to at least one of the mutually facing surfaces of first holding element (11, 12) and core element (13), aligning first holding element (11, 12) with first forming tool (40) such that support surface is matched to predetermined master surface (41) of first forming tool (40), and curing the adhesive, wherein first adhesive connecting layer (15) is formed, which has thickness variations constituted by form deviations between support surface and at least one of the mutually facing surfaces. Also described is a holding apparatus (100) configured to electrostatically hold a component, e.g., silicon wafer (1).

16 Claims, 2 Drawing Sheets

(56) References Cited

U.S. PATENT DOCUMENTS

| | | |
|---|---|---|
| 2006/0016554 A1 | 1/2006 | Ahn |
| 2009/0308538 A1 | 12/2009 | Yonekura et al. |
| 2009/0310274 A1 | 12/2009 | Koyama et al. |
| 2010/0039747 A1 | 2/2010 | Sansoni et al. |
| 2010/0206454 A1 | 8/2010 | Maeda et al. |
| 2011/0229837 A1* | 9/2011 | Migita .................. C23C 14/50 432/227 |
| 2012/0247664 A1* | 10/2012 | Kobayashi .............. H01L 24/75 156/285 |
| 2012/0299253 A1 | 11/2012 | Kosakai et al. |
| 2013/0027838 A1* | 1/2013 | Hori .................... H01L 21/6833 361/234 |
| 2013/0033690 A1 | 2/2013 | Helmus et al. |
| 2013/0148253 A1 | 6/2013 | Komatsu et al. |
| 2013/0308116 A1 | 11/2013 | Helmus et al. |
| 2014/0008880 A1 | 1/2014 | Miura et al. |
| 2014/0042716 A1 | 2/2014 | Miura et al. |
| 2014/0376148 A1 | 12/2014 | Sasaki et al. |

FOREIGN PATENT DOCUMENTS

| | | |
|---|---|---|
| JP | 2007027494 A | 2/2007 |
| WO | 2013118781 A1 | 8/2013 |
| WO | 2013160026 A2 | 10/2013 |

\* cited by examiner

METHOD FOR PRODUCING AN ELECTROSTATIC HOLDING APPARATUS

BACKGROUND OF THE INVENTION

The invention relates to a method for producing a holding apparatus designed to electrostatically hold a component, in particular a silicon wafer. The invention also relates to a holding apparatus produced by this method. Applications of the invention are in the production of devices or tools for holding components by means of electrostatic forces, in particular for holding semiconductor components such as, for example, silicon wafers.

Holding apparatuses for holding components electrostatically, which are also referred to as electrostatic holding apparatuses, electrostatic clamping apparatuses, electrostatic clamps, ESCs or electrostatic chucks, are known in general. An important application of electrostatic holding apparatuses is in holding silicon wafers in lithographic semiconductor processing, for example in chip production, in which particular advantages of electrostatic holding that are exploited are ease of switching of electrostatic holding forces, high positioning accuracy and reliable fixing of the silicon wafer in a vacuum.

In semiconductor processing, there are particular requirements relating to positioning accuracy. Silicon wafers are typically flexible semiconductor wafers, which have to be held with as perfect a planarity as possible, e.g. with deviations of less than 15 nm from the flat form, for exposures in the lithography process. For this purpose, it is necessary for the holding apparatus to have a flat, free support surface for receiving the silicon wafer, and a high mechanical and thermal stability.

Typically, an electrostatic holding apparatus has a structure having a plurality of plate-type or layer-type elements that perform differing functions. For example, an electrostatic holding apparatus having a plurality of plate-type elements is described in US 2013/0033690 A1. At least one plate-type element (referred to as a core element in the following), for example made of a mechanically stiff ceramic, has a carrying and cooling function. At least one further plate-type element (referred to as a holding element in the following) performs the electrostatic holding function of the holding apparatus. For this purpose, the holding element is equipped with an electrode device, by means of which the electrostatic holding forces are generated. Since the electrostatic holding forces are reduced as the distance from the electrode device increases, the holding element is as thin as possible. In order nevertheless to impart the required mechanical and thermal stability to the holding element, it is fixedly connected to the core element, for example as in US 2013/0033690 A1, by anodic bonding.

The conventional holding apparatus has the disadvantage that the form of the support surface of the holding element follows the surface form of the core element, as a result of being connected to the core element by anodic bonding. However, the core element may have form deviations from the desired form of the support surface, in particular from a flat form, such that the support surface also becomes deformed by the anodic bonding. There may additionally be form deviations, relative to the support surface, on the surface of the holding element that faces towards the core element. Consequently, in the case of the conventional electrostatic holding apparatus, deviations in the form of the support surface, for example from the desired planarity, may occur, that have a disadvantageous effect upon the semiconductor processing of the silicon wafer, in particular in the exposure of the latter. Hitherto, it has only been possible to avoid these problems by elaborate processes for setting the planarity, this having a disadvantageous effect upon the duration of production.

The said disadvantage occurs, not only in the case of electrostatic holding apparatuses for silicon wafers, but generally in the case of all holding apparatuses whose use requires a support surface of highly exact form.

OBJECTS OF THE INVENTION

The objective of the invention is to provide an improved method for producing an electrostatic holding apparatus that avoids disadvantages of conventional techniques. The method is intended, in particular, to make it possible to produce the holding apparatus with an improved exactness of form of the support surface for receiving the component, and/or with a shortened production duration. A further objective of the invention is to provide an improved electrostatic holding apparatus that avoids disadvantages of conventional holding apparatuses, and that is distinguished, in particular, by an increased exactness of form of the support surface for receiving the component.

These objectives are achieved, respectively, by a method for producing a holding apparatus and by a holding apparatus of the invention.

DESCRIPTION OF THE INVENTION

Provided according to a first general aspect of the invention is a method for producing a holding apparatus for electrostatically holding a component such as, for example, a silicon wafer, wherein a plate-type first holding element (upper holding element), which has a first electrode device (upper electrode device) and which spans a support surface for receiving the component, and a plate-type core element are connected to each other. According to the invention, the first holding element and the core element are adhesive-bonded to each other. A liquid adhesive is used, which is hardened (for example, by polymerization) by means of, for example, a chemical transformation process and/or a heating process. The first holding element is aligned with a first forming tool (upper forming tool), wherein the support surface of the first holding element is matched to a predetermined master surface (or master forming surface) of the first forming tool. The support surface of the first holding element and the master surface are in positive contact. Advantageously, unlike the example of anodic bonding, the form of the support surface is thereby determined by the form of the master surface of the first forming tool, the forming of the support surface being unaffected by the forms of the mutually facing surfaces of the first holding element and of the core element. According to the invention, the adhesive between the first holding element and the core element is cured (hardened), forming a first adhesive connecting layer (upper adhesive connecting layer) that compensates deviations of the forms of the mutually facing surfaces, of the first holding element and of the core element, from the desired form of the support surface. The first adhesive connecting layer is distinguished by thickness variations that are constituted by form deviations between the support surface, for example the flat form of the support surface, and the mutually facing surfaces of the first holding element and of the core element.

According to a second general aspect of the invention, the above-mentioned objective is achieved by a holding apparatus for electrostatically holding a component such as, for example, a silicon wafer, that has a basic body having a plate-type first holding element and a plate-type core element. The first holding element and the core element are disposed over one another in the form of a stack. The first holding element is equipped with a first electrode device. According to the invention, the first holding element and the core element are connected via a first adhesive connecting layer, which has thickness variations that are constituted by form deviations between the form of the support surface and at least one of the mutually facing surfaces of the first holding element and the core element. Preferably, the holding apparatus according to the invention is produced by means of the method according to the above-mentioned first aspect of the invention.

The invention offers the following advantages. Firstly, the production of the electrostatic holding apparatus is simplified considerably, without impairment of the exactness of the form of the support surface. The core element, which is preferably made of a ceramic, can be provided in a simplified manner, since requirements relating to the exactness of form of the surface of the core element are less than in the case of conventional holding apparatuses. The form of the support surface for receiving the component is the same as the form of the master surface of the first forming tool. Unlike the case of conventional holding apparatuses, deformations in the stack structure of the plate-type elements do not affect the form of the support surface. In addition, a particular advantage identified by the inventors consists in that the adhesive connecting layer has a high dimensional stability, such that durable operation of the holding apparatus according to the invention can be achieved.

Advantageously, the invention can be applied generally to the production of holding apparatuses that have a plate-type (or: layer-type) core element and a plate-type (or: layer-type) first holding element. There are no limitations in respect of the structure of the core element or of the first holding element. The core element may be produced, as one single layer or multiple layers, from one single (partial) plate or (partial) layer, or from a plurality thereof, that form a mechanically and thermally stable carrier of the first holding element and, if necessary, of further parts of the holding apparatus.

The core element is typically free of electrodes for the electrostatic holding function, and it may optionally be equipped with a temperature adjustment device, in particular a resistance heating system, a Peltier cooling system and/or at least one temperature adjustment medium line for receiving a temperature adjustment medium. The temperature adjustment medium line is designed to receive a temperature adjustment medium (heating or cooling medium).

The first holding element may likewise be of one single layer or multiple layer structure. The first electrode device comprises, along the extent of the first holding element, one single electrode layer or a plurality of mutually adjacent electrode layers that are embedded in the first holding element or on the free surface thereof. Preferably, the first holding element has, on its free surface, a multiplicity of projecting first burls (upper burls), which may also be referred to as first carrier elements and whose free ends span the support surface for receiving the component. The burls are disposed spaced apart from each other, with gaps that advantageously can receive unwanted particles, e.g. dust particles or other contaminants, which interfere with the bearing contact of the component on the support surface.

The core element is made, for example, of ceramic such as, for example, SiSiC, $Al_2O_3$, AlN, $Si_3N_4$, LiAl-silicate or glass, such as, for example, borosilicate glass. The first holding element is composed of one or more layers of dielectric materials such as, for example, of alkali-free borosilicate glass or ceramic, such as $Al_2O_3$, AlN or $Si_3N_4$. An electrically insulating layer such as, for example, a borosilicate glass wafer, might be provided.

According to a preferred embodiment of the invention, the first holding element is aligned on the master surface of the first forming tool, while the first holding element and the core element are pressed against each other by means of the forming tool. A pressing force is exerted by means of the forming tool, while the core element is supported by a stationary platform, e.g. a reference plate. The pressing of the first holding element and core element against each other is preferably effected in such a manner that the thickness of the first adhesive connecting layer is less than 100 µm, in particular less than 50 µm or, for example, less than 30 µm. Such small thicknesses of the adhesive connecting layer advantageously favor an adhesive connection with a vanishingly small or negligible shrinkage of the adhesive, and the thermal coupling between the core element and the first holding element. Preferably, the pressing is effected such that the pressure no longer deforms the entire component during the curing process.

According to an alternative advantageous embodiment of the invention, the aligning of the first holding element may include temporary and stress-free mounting of the first holding element and the core element on a dimensionally stable, stationary reference plate. The mounting is stress-free in respect of holding forces that could deform the component. The composite of core element and first holding element is mounted in a floating manner on the reference plate. The stress-free mounting may be constituted by a deformable carrier layer, for example, composed of a plastic, or by a further, separable adhesive connecting layer between the core element and the reference plate. The stress-free mounting of the first holding element and the core element during the adhesive bonding process can have advantages for the lasting mechanical and thermal stability of the holding apparatus. Furthermore, the stress-free mounting can result in a greater thickness of the adhesive connecting layer than with an exerted pressing force, for example a thickness greater than 150 µm. In this case, in order to avoid shrinkage effects, an adhesive having a volume shrinkage of preferably less than 1%, particularly preferably less than 0.1%, is used.

Depending on the properties of the adhesive that is used, it may suffice if the alignment of the first holding element with the first forming tool is maintained until curing of the adhesive commences. According to a preferred embodiment of the invention, however, it is provided that the first holding element remains positively connected to the first forming tool until curing is complete. Preferably, the pressing force is maintained during the entire curing process. Advantageously, this precludes subsequent deformation of the adhesive connecting layer, for example as a result of capillary forces. The pressing force may be generated, for example, by electrostatic forces and/or by hydrostatic forces, for example a negative pressure. For this purpose, the first forming tool is equipped accordingly with an electrode and/or a vacuum system.

Advantageously, there are no limitations in respect of the form of the master surface of the first forming tool. According to a first variant, the master surface may be a plane surface, such that the holding apparatus according to the invention is formed with a plane support surface. Alternatively, the master surface of the first forming tool may have a curved form, for example in order to create a support surface for curved components such as, for example, preformed silicon wafers, or in order to compensate a possible subsequent deformation of the support surface resulting from a shrinkage of the adhesive or deformations of the holding apparatus.

Preferably, the holding apparatus according to the invention is configured to hold silicon wafers. For this application, the first holding element has burls, the free end faces of which constitute the support surface for receiving the component. According to a first variant, the burls may be produced during production of the first holding element, before it is connected to the core element. For example, structuring of the surface of the first holding element may be provided. The structuring may be effected, for example, by etching, as known from the production of conventional holding apparatuses. In this case, the process of aligning the first holding element and curing the adhesive includes the end faces of the burls being in positive bearing contact with the master surface of the first holding element. According to a second variant, the first holding element may initially have a smooth, non-structured surface while it is connected to the core element, and the structuring of the first holding element in order to form the projecting burls may be effected after the first holding element and the core element have been connected. In this case, the first forming tool is preferably equipped with projecting support elements, which are disposed, with mutual gaps, over the extent of the underside of the first forming tool and span the master surface. By means of the support elements, the effective contact surface area is reduced, and thus the influence of particles on the achievable planarity is minimized. Advantageously, unwanted particles that could interfere with the bearing contact of the surface of the first holding element on the master surface are received in the gaps between the support elements.

According to a further, particularly preferred embodiment of the invention, the holding apparatus may be fitted with a plate-type, second holding element (lower holding element), which is disposed on the side of the core element that is opposite to the first holding element, and which has a second electrode device and spans a carrier surface for carrying the holding apparatus on a platform. The second holding element advantageously enables the holding apparatus to be positioned and temporarily fixed on the platform by the action of electrostatic forces. Preferably, the second holding element is connected to the core element by means of a second adhesive connecting layer (lower adhesive connecting layer). It is provided in this case, advantageously, that the second holding element is aligned with a second forming tool (lower forming tool), with the carrier surface being matched to a predetermined master surface of the second forming tool, and curing of the adhesive between the mutually facing surfaces of the second holding element and the core element.

Advantageously, the connecting of the first holding element and the core element, on the one hand, and the connecting of the second holding element and the core element, on the other hand, may be effected simultaneously. Setting a working distance between the first forming tool and the second forming tool allows the first holding element and the second holding element to be aligned, respectively, on the master forming surfaces of the first forming tool or of the second forming tool. This variant of the invention advantageously simplifies the above-mentioned embodiment of the method according to the invention, in which stress-free mounting of the first holding element and of the core element is provided.

According to another variant of the invention, the said connections may be effected sequentially, in that the first holding element and the core element are connected first, and then the second holding element and the core element are connected (or vice versa).

Advantageously, the method features stated above in relation to the first holding element may also be provided, individually or in combination, in the connection of the second holding element to the core element. In particular, it may be provided that the second holding element and the core element are pressed against each other in such a manner that the thickness of the second adhesive connecting layer is less than 100 µm, in particular less than 50 µm, or less than 30 µm. Furthermore, it may be provided that the second holding element is positively connected to the second forming tool throughout the entire process of curing the adhesive. Finally, the master surface of the second forming tool may be flat or curved, depending on the requirements of the specific application of the invention.

Preferably, the second holding element is also equipped with a multiplicity of projecting, second burls (lower burls), which may also be referred to as second carrier elements, and which are disposed in a distributed manner, with mutual gaps, over the carrier surface, and whose free end faces span the carrier surface for carrying the holding apparatus on the platform. As in the case of the first holding element, the second burls of the second holding element may be formed, before or after the connection to the core element, by a structuring of the free surface of the second holding element.

The adhesive for connecting the first and/or second holding elements to the core element may be selected in dependence on the materials of the adjoining elements. Preferably, an adhesive is used that is pourable while the holding and core elements are being joined, i.e. during the alignment of the first and/or second holding element, such that the adhesive connecting layer is formable and the adhesive is displaceable along the extent of the adhesive connecting layer. Particularly preferably, during the joining process the adhesive has a viscosity of less than 1000 cPs. Furthermore, preferably, an adhesive is used that, during the curing process, has a volume shrinkage of less than 5%, in particular less than 1%.

BRIEF DESCRIPTION OF THE DRAWINGS

Further details and advantages of the invention are described in the following with reference to the appended drawings. There are shown in.

Preferred embodiments of the electrostatic holding apparatus according to the invention, and of the method for producing it, are described in the following with reference, exemplarily, to an electrostatic holding apparatus for silicon wafers. However, the implementation of the invention is not limited to holding apparatuses for silicon wafers. Rather, other applications of the holding apparatus are also conceivable, such as, for example, for holding display glasses, in which cases the form of the support surfaces and/or carrier surfaces of the first and/or second holding elements, their structuring, the materials and the dimensions are matched to the specific requirements. Furthermore, it is emphasized that the implementation of the invention is not limited to the exemplarily shown variants of the holding apparatus having a single-piece core element and having a multilayer holding element. The structure of the basic body of the holding apparatus, comprising the holding and core elements, may be selected, as is known per se from conventional holding apparatuses. Further details of the actual design of the holding apparatus, for example as a monopolar or bipolar holding apparatus, and of the temperature adjustment and application of voltages to generate the electrostatic holding forces, are not described insofar as these are known from conventional holding apparatuses.

Finally, it is emphasized that the figures do not show scale illustrations of holding apparatuses, but illustrate the production of the adhesive connecting layers between the core element and the first and/or second holding elements. In particular, the form deviations between the support surfaces and carrier surfaces of the first and second holding elements and the mutually facing surfaces of the core element and of the first and second holding elements are represented in an exaggerated form for illustrative purposes. In practice, in the case of the corresponding surfaces having an extent of, for example, 30 cm to 45 cm, the form deviations are less than 1 µm.

Figure 1:
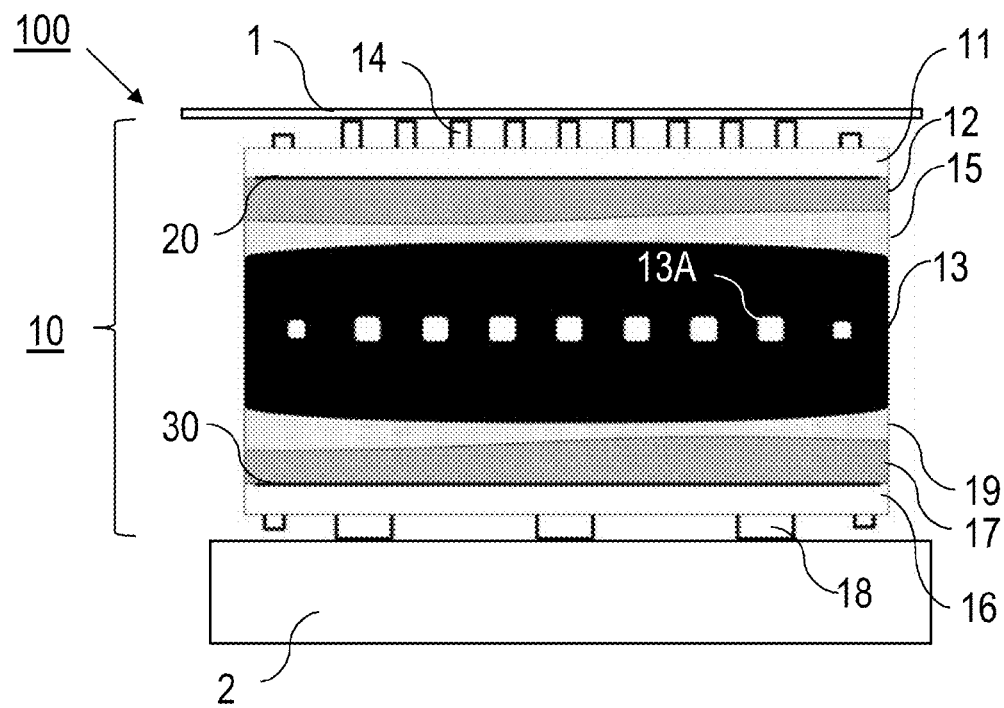
FIG. 1: a schematic sectional view of a preferred embodiment of the electrostatic holding apparatus according to the invention.

Shown schematically in FIG. 1 is an embodiment of the electrostatic holding apparatus 100 according to the invention, applied in semiconductor processing. The holding apparatus 100, for the purpose of holding a component 1, e.g. a silicon wafer, is fixed on a platform 2. Both the holding of the component 1 and the fixing on the platform 2 are effected by the action of switchable electrostatic forces. The holding apparatus 100 comprises a basic body 10, a first (upper) electrode device 10 and a second (lower) electrode device 30. The basic body 10 has a stack structure, which is composed of a core element 13, a first (upper) holding element 11, 12, and a second (lower) holding element 16, 17. The core element 13 comprises a plate-type ceramic body, which is made, for example, of SiSiC and in which a temperature adjustment device, having temperature adjustment medium lines 13A, is embedded. The core element has, for example, a lateral dimension (diameter) of 45 cm and a thickness of 10 mm, the diameter of the temperature adjustment medium lines 13A being, for example, 2 mm. The upper and lower surfaces of the core element 13 are planar, with deviations from planarity being in the range of around 40 nm, owing to limitations resulting from the fine structure of the ceramic. The deviations from planarity may also be greater, e.g. up to 20 µm, depending on the microstructure (two-phase property of the ceramic). These deviations are illustrated in FIG. 1 by the curved surfaces of the core element 13.

The first holding element 11, 12 is composed of two electrically insulating layers, of which the upper layer 11 is made, for example, of alkali-free borosilicate glass and, on its free surface, has the projecting burls 14, which have a height of, for example, 5 µm to 25 µm. The burls 14 are rectangular or cylindrical in shape, as represented in FIG. 1. Alternatively, they may be of a different shape, such as, for example, that of a truncated cone, a cone, a truncated pyramid, or a pyramid. The free end faces of the upper burls 14 span a flat support surface for the component 1. The lower layer 12 of the first holding element 11, 12 is likewise made, for example, of alkali-free borosilicate glass. The first electrode device 20, which is connected to a voltage supply via an electric line (not represented) and configured to receive a holding voltage, is embedded between the layers 11, 12. The electrode device 20 comprises, for example, a continuous electrode layer, which is made of chrome. The thickness of the first holding element 11, 12 is preferably selected so as to be in the range of from 0.2 mm to 2 mm, and is, for example, 0.5 mm.

The second holding element 16, 17 is likewise composed of a lower layer 16, having second burls 18 that face downwards, and of an upper layer 17 of electrically insulating materials. The second electrode device 30, in the form of an electrode layer, is embedded between the layers 16, 17. The second electrode device 30 is likewise connected to the voltage source, via a line (not represented), for the purpose of receiving a holding voltage. The second burls 18 span a carrier surface, by which the holding apparatus 100 lies on the platform 2, and they may be of the same shape as the first burls 14, or of a different shape. The height of the second burls 18 is selected, like the height of the first burls, to be for example 5 µm to 25 µm.

Figures 2, 3:
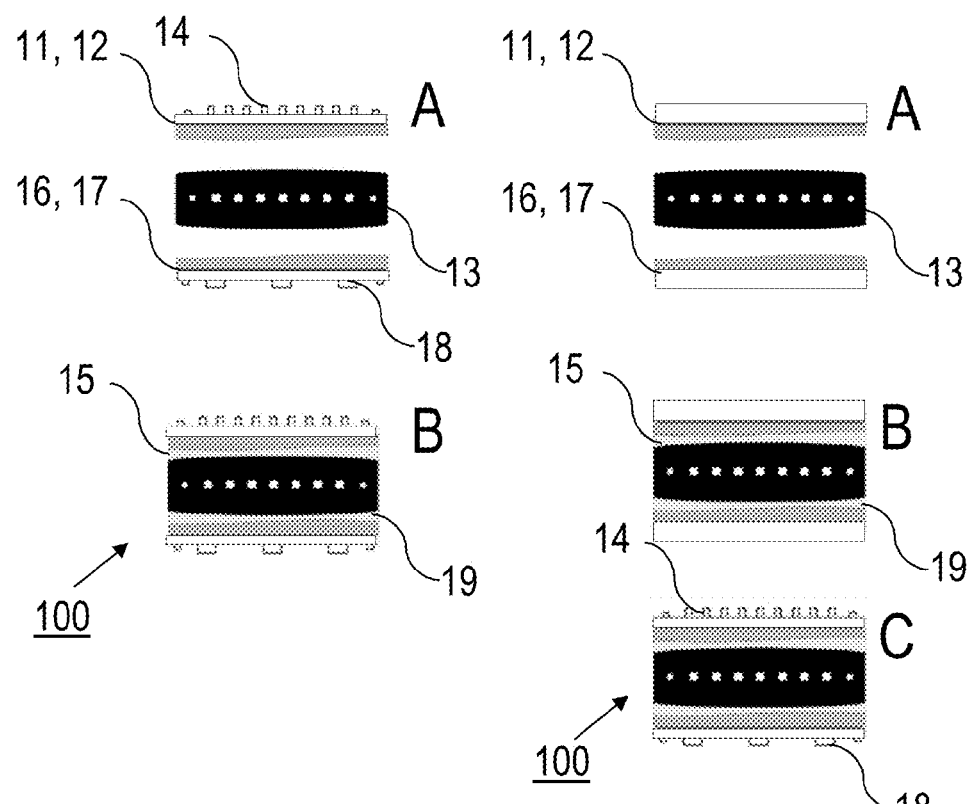
FIGS. 2 and 3: schematic illustrations of the formation of projecting carrier elements.

FIGS. 2 and 3 show two variants of the method according to the invention, which differ in the structuring of the first and second holding elements 11, 12 and 16, 17 before (FIG. 2) or after (FIG. 3) connection to the core element 13. According to FIG. 2A, the first holding element 11, 12, the core element 13 and the second holding element 16, 17 are provided separately, as prefabricated components. The sides of the first and second holding elements 11, 12 and 16, 17, which are provided as free surfaces in the finished holding apparatus, have the burls 14, 18. The components are bonded together by an adhesive, by means of the method according to the invention, having preferred features, which is explained below with reference to FIGS. 4 and 5. In the finished holding apparatus 100 (FIG. 2B), the first and second holding elements 11, 12 and 16, 17 are respectively connected to the core element 13 via upper and lower adhesive connecting layers 15, 19.

In the case of the variant according to FIG. 3, the first and second holding elements 11, 12 and 16, 17 are first provided with unstructured surfaces (FIG. 3A). Following connection of the first and second holding elements 11, 12 and 16, 17 to the core element, according to the method according to the invention (FIG. 3B), the free surfaces of the holding apparatus 100 are structured to form the burls 14, 18 (FIG. 3C).

According to FIG. 2, the burls 14, 18 are positively connected to the respective master forming surfaces 41, 51 of the first and second forming tools 40, 50 (see FIG. 4) during the aligning of the first and second holding elements 11, 12 and 16, 17 and the curing of the adhesive. Any particles present that could interfere with the aligning process and cause the support surface to bend are received in the gaps between the burls 14 and 18. In the case of the variant according to FIG. 3, the unstructured surfaces of the first and second holding elements 11, 12 and 16, 17 can bear against likewise unstructured master forming surfaces 41, 51 of the first and second forming tools 40, 50. In this case, however, in order to avoid unwanted disturbance by particles, the master forming surfaces 41, 51 are preferably equipped with support elements 42, 52. The support elements 42, 52 are disposed, with mutual gaps, over the master forming faces 41, 51 or, as shown schematically in FIGS. 4 and 5, distributed at the edges of the latter. Gaps, which can receive potentially disturbing particles during the joining process, are formed between the support elements 42, 52.

Figure 4:
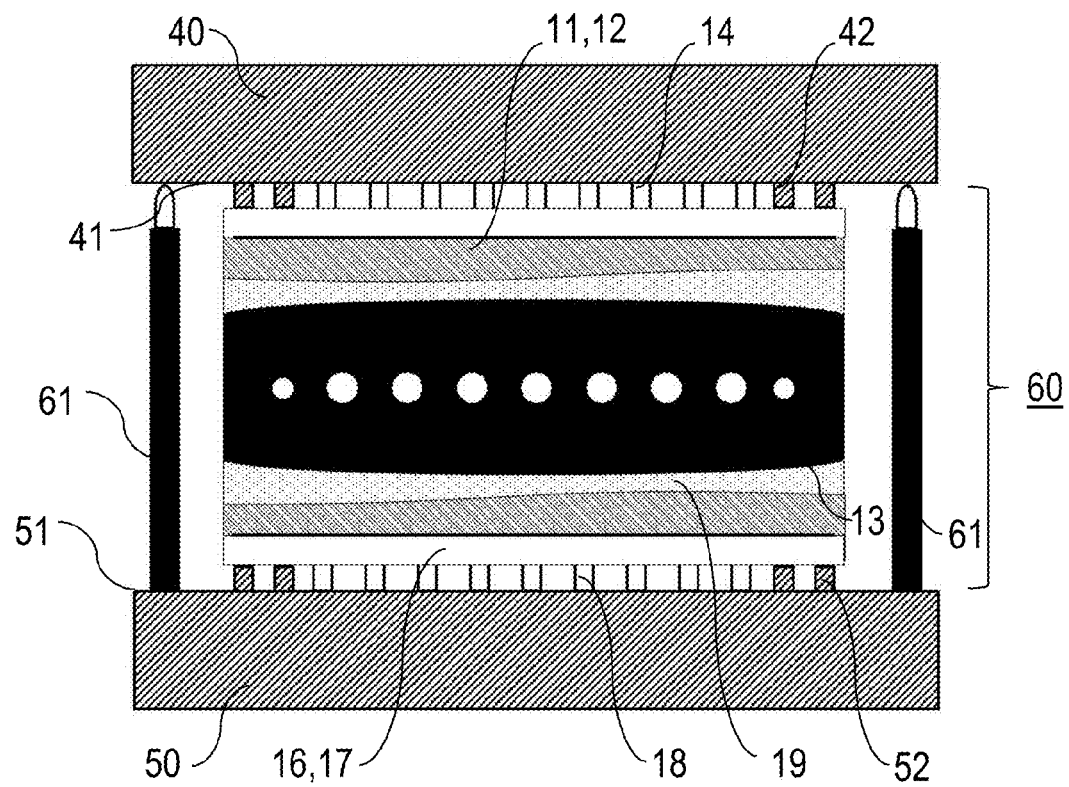
FIG. 4: a schematic illustration of a preferred embodiment of the method according to the invention.

Illustrated schematically in FIG. 4 is an embodiment of the method according to the invention in which the first holding element 11, 12 and the second holding element 16, 17 are connected simultaneously to the core element 13. In a preparation step, the separately prepared components (see FIG. 2A) are prepared for the joining process. An adhesive such as, for example, a two-component epoxy adhesive or a UV-curing adhesive, is applied to at least one of the mutually facing surfaces of the core element 13 and of the first and second holding elements 11, 12 and 16, 17. The application of the adhesive can be effected by methods known per se, such as, for example, pouring-on or spraying-on. A layer of liquid adhesive is formed, for which a least possible thickness is selected, such that the layer is closed and the respective surface is fully covered.

The forming tools 40, 50 shown in FIG. 4 are then used to join the components together. The lower forming tool 50 has a flat master forming surface 51, possibly having support elements 52. The second holding element 16, 17 is placed with the burls 18 on to the master forming surface 51. The core element 13 is then placed on to the second holding element 16, 17, the gap between the two components being completely filled with the adhesive, without any bubbles. In a further step, the first holding element 11, 12 is placed on to the core element 13, the gap between the two components likewise being completely filled with adhesive, without any bubbles. The upper forming tool 40 is disposed above the first holding element 11, 12, such that its matrix forming surface 41, possibly having support elements 42, contacts the free surface of the first holding element 11, 12, in particular the projecting burls 14.

The forming tools 40, 50 are equipped with an adjustment device 60, which allows the distance between the matrix forming surfaces 41, 51 of the upper and lower forming tools 40, 50 to be set. The adjustment device 60 comprises, for example, rod-type spacers 61. The spacers 61 are provided to set the desired spacing of the matrix forming surfaces 41, 51, and have an adjustable length, as shown schematically in FIG. 4, or are realized as exchangeable rods.

In the state shown in FIG. 4, the first and second holding elements 11, 12 and 16, 17 are aligned to the matrix forming surfaces 41, 51 of the upper and lower forming tools 40, 50. The form of the support surfaces or carrier surfaces spanned by the burls 14, 18 is determined by the form of the matrix forming surfaces 41, 51. In the example illustrated, the matrix forming surfaces 41, 51 are plane faces, such that the support surface spanned by the upper burls 14 and the carrier surface spanned by the lower burls 18 are likewise plane faces. Deviations from planarity that are present on the mutually facing surfaces of the core element 13 and of the first and second holding elements 11, 12 and 16, 17 are accommodated by the adhesive connecting layer 15, 19. In this state, curing of the adhesive is effected, for example, by the delivery of heat or UV radiation.

The positive connection of the matrix forming faces 41, 51 to the respective surfaces of the first and second holding elements 11, 12 and 16, 17 is effected by a pressing force, which is generated, for example, by the weight of the upper forming tool 40, a negative pressure or electrostatic holding forces between the first holding element 11, 12 and the upper forming tool 40, and between the second holding element 11, 12 and the lower forming tool 50. The positive connection is preferably maintained throughout the entire curing process. Following the curing process, the stack structure, composed of the first holding element 11, 12, the first adhesive connecting layer 15, the core element 13, the second adhesive connecting layer 19 and the second holding element 16, 17, is removed from the forming tools 40, 50 and subjected to a finishing process. The finishing process comprises, for example, the deposition of a wear protection layer on the surfaces of the holding elements. Furthermore, adhesive residues are removed from the edges of the components, and the first and second electrode device 20, 30 and the temperature adjustment medium lines 13A are provided with connectors.

Figure 5:
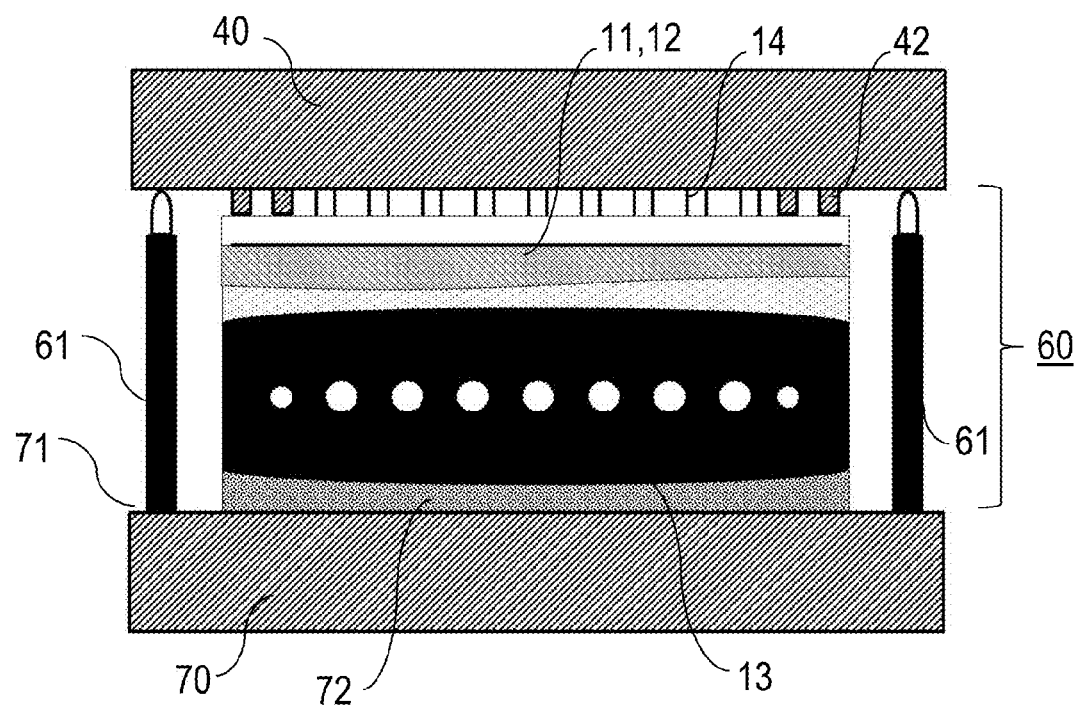
FIG. 5: a schematic illustration of a further embodiment of the method according to the invention.

Shown schematically in FIG. 5 is a further embodiment of the invention, in which the core element 13 is connected to the first holding element only on one side. This variant of the invention is provided, for example, if a second holding element is not required on the underside of the holding apparatus, or if the second holding element is to be subsequently connected to the core element 13 in a separate step.

In the case of the embodiment according to FIG. 5, a lower reference plate 70 is provided, which may be constructed, for example, like the lower forming tool 50 according to FIG. 4, or constituted simply by a mechanically stable plate, for example of steel or plastic. Disposed on the upper surface 71 of the reference plate 70 is a flowable carrier layer 72, on which the core element 13 is bedded. The first holding element 11, 12, comprising the upwardly projecting burls 14, is disposed on the core element 13, the gap between the mutually facing surfaces of these components being filled completely with adhesive, without bubbles. The distance between the reference plate 70 and the first forming tool 40 is set by an adjustment device 60, as shown in FIG. 4. The form of the support surface spanned by the burls 14 is set by the matrix forming surface of the upper forming tool 40, irrespective of any deformations of the mutually facing surfaces of the first holding element 11, 12 or of the core element 13.

The embodiment according to FIG. 5 achieves a floating mounting of the core element 13 and of the first holding element 11, 12 by means of the adhesive connecting layer 15 of the carrier layer 72, such that the first holding element 11, 12 is free from mechanical stresses during the processes of aligning and curing the adhesive. The carrier layer 72 is, for example, a temporary adhesive connecting layer, which can be liquefied and removed by delivered heat following the curing of the adhesive connecting layer 15.

The features of the invention disclosed in the preceding description, the drawings and the claims can be of significance, both singly or in combination, for the implementation of the invention in its various designs.

What is claimed is:

1. A method for producing a holding apparatus adapted to electrostatically hold a component, comprising the step:
    connecting a plate-type first holding element and a plate-type core element, wherein
    the first holding element comprises a first electrode device and spans a support surface for receiving the component, wherein the connecting step comprises:
    providing a liquid adhesive to at least one of mutually facing surfaces of the first holding element and of the core element,
    aligning the first holding element with a first forming tool in such a manner that the support surface is matched to a predetermined master surface of the first forming tool, said master surface determining a desired planar or curved form laterally extending along the support surface, and
    curing the adhesive, wherein a first adhesive connecting layer is formed, which has thickness variations that are constituted by form deviations between a form of the support surface and surface forms of at least one of the mutually facing surfaces of the first holding element and of the core element along lateral extensions thereof.

2. The method according to claim 1, wherein
the aligning of the first holding element comprises pressing the first holding element on to the core element by use of the first forming tool, in such a manner that the first adhesive connecting layer has a thickness of less than 100 µm.

3. The method according to claim 1, wherein
the aligning of the first holding element comprises stress-free mounting of the first holding element and of the core element on a dimensionally stable platform.

4. The method according to claim 1, wherein
during the curing of the adhesive, the first holding element is positively connected to the first forming tool.

5. The method according to claim 1, wherein
the master surface of the first forming tool is planar, or curved in such a manner that the support surface of the first holding element is planar following a shrinkage of the adhesive.

6. The method according to claim 1, wherein
the first holding element has a multiplicity of projecting first burls, whose free ends span the support surface for receiving the component and bear against the master surface of the first forming tool during the aligning of the first holding element and the curing of the adhesive.

7. The method according to claim 1, wherein
following the connecting of the first holding element and the core element, structuring of the first holding element is effected in such a manner that a multiplicity of projecting first burls are formed, whose free ends span the support surface for receiving the component.

8. The method according to claim 1, further comprising the step
connecting a plate-type second holding element and the core element, wherein
the second holding element has a second electrode device and spans a carrier surface for carrying the holding apparatus on a platform, and
the connecting of the second holding element and the core element comprises:
providing the adhesive on at least one of the mutually facing surfaces of the second holding element and of the core element,
aligning the second holding element with a second forming tool in such a manner that the carrier surface is matched to a predetermined master surface of the second forming tool, and
curing the adhesive, wherein a second adhesive connecting layer is formed, which has thickness variations that are constituted by form deviations between the carrier surface and at least one of the mutually facing surfaces of the second holding element and of the core element.

9. The method according to claim 8, wherein
the connecting of the first holding element and of the core element, and the connecting of the second holding element and of the core element, are effected simultaneously, wherein
the aligning of the first holding element and of the second holding element comprises setting a working distance between the first forming tool and the second forming tool.

10. The method according to claim 8, wherein
the connecting of the first holding element and of the core element, and the connecting of the second holding element and of the core element, are effected sequentially.

11. The method according to claim 8, including at least one of the features of
the aligning of the second holding element comprises pressing the second holding element on to the core element by use of the second forming tool in such a manner that the second adhesive connecting layer has a thickness of less than 100 µm,
during the curing of the adhesive, the second holding element is positively connected to the second forming tool, and
the master surface of the second forming tool is planar, or curved in such a manner that the carrier surface of the second holding element is planar following a shrinkage of the adhesive.

12. The method according to claim 8, wherein
the second holding element has a multiplicity of projecting second burls, whose free ends span the carrier surface for carrying the holding apparatus on the platform and bear against the master surface of the second forming tool during the aligning of the second holding element and the curing of the adhesive.

13. The method according to claim 8, wherein
following the connecting of the second holding element and the core element, structuring of the second holding element is effected in such a manner that a multiplicity of projecting first burls are formed, whose free ends span the carrier surface for carrying the holding apparatus on the platform.

14. The method according to claim 1, wherein the adhesive has at least one of the features
the adhesive has a viscosity of less than 1000 cPs, and
the adhesive has a curing volume shrinkage of less than 5%.

15. A holding apparatus adapted to electrostatically hold a component, comprising:
a basic body, which comprises a plate-type first holding element and a plate-type core element, wherein
the first holding element comprises a multiplicity of projecting first burls, whose free ends span a support surface for receiving the component, said support surface having a planar or curved form laterally extending along the support surface, and a first electrode device, wherein
mutually facing surfaces of the first holding element and of the core element are connected to each other via a first adhesive connecting layer, and
the first adhesive connecting layer comprises thickness variations that are constituted by form deviations between the form of the support surface and surface forms of at least one of the mutually facing surfaces of the first holding element and of the core element along lateral extensions thereof.

16. The holding apparatus according to claim 15, wherein
the basic body further comprises a plate-type second holding element, which is connected to the core element, opposite the first holding element,
the second holding element comprising a multiplicity of projecting second burls, whose free ends span a carrier surface for carrying the holding apparatus on a platform, and a second electrode device,
mutually facing surfaces of the second holding element and of the core element are connected to each other via a second adhesive connecting layer, and
the second adhesive connecting layer comprises thickness variations that are constituted by form deviations between the carrier surface and at least one of the mutually facing surfaces of the second holding element and of the core element.

* * * * *